United States Patent
Butterworth et al.

(10) Patent No.: US 9,391,243 B2
(45) Date of Patent: Jul. 12, 2016

(54) PHOSPHOR SEPARATED FROM LED BY TRANSPARENT SPACER

(71) Applicant: KONINKLIJKE PHILIPS N.V., Eindhoven (NL)

(72) Inventors: Mark Melvin Butterworth, San Jose, CA (US); Kenneth Vampola, Los Altos, CA (US)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 14/412,026

(22) PCT Filed: Jun. 25, 2013

(86) PCT No.: PCT/IB2013/055207
§ 371 (c)(1),
(2) Date: Dec. 30, 2014

(87) PCT Pub. No.: WO2014/006539
PCT Pub. Date: Jan. 9, 2014

(65) Prior Publication Data
US 2015/0207041 A1    Jul. 23, 2015

Related U.S. Application Data

(60) Provisional application No. 61/668,062, filed on Jul. 5, 2012.

(51) Int. Cl.
*H01L 33/50* (2010.01)
*H01L 33/52* (2010.01)
*H01L 33/58* (2010.01)

(52) U.S. Cl.
CPC .............. *H01L 33/50* (2013.01); *H01L 33/507* (2013.01); *H01L 33/52* (2013.01); *H01L 33/58* (2013.01); *H01L 33/505* (2013.01)

(58) Field of Classification Search
None
See application file for complete search history.

(56) References Cited

U.S. PATENT DOCUMENTS

| | | |
|---|---|---|
| 6,274,399 B1 | 8/2001 | Kern |
| 6,649,440 B1 | 11/2003 | Krames |
| 2003/0071568 A1 | 4/2003 | Lowery et al. |
| 2005/0269582 A1 | 12/2005 | Mueller |
| 2006/0060867 A1 | 3/2006 | Suehiro |
| 2006/0281203 A1 | 12/2006 | Epler |
| 2008/0283864 A1 | 11/2008 | Le Toquin et al. |
| 2008/0308824 A1* | 12/2008 | Shchekin et al. ........... 257/98 |
| 2008/0310158 A1 | 12/2008 | Harbers et al. |
| 2011/0198638 A1* | 8/2011 | Wang ........................ 257/98 |

FOREIGN PATENT DOCUMENTS

| | | |
|---|---|---|
| EP | 1988583 A1 | 11/2008 |
| WO | 2007141763 A1 | 12/2007 |

\* cited by examiner

*Primary Examiner* — Alexander Ghyka
(74) *Attorney, Agent, or Firm* — Patent Law Group LLP; Brian D. Ogonowsky

(57) ABSTRACT

To reduce absorption by an LED die (12) of light emitted by a phosphor layer (48), the absorbing semiconductor layers of the LED die (12) are separated from the phosphor layer by a relatively thick glass plate (44) affixed to the LED die or by the LED die transparent growth substrate. Therefore, phosphor light emitted at a sufficient angle towards the LED die will pass through the transparent spacer (44) and exit the sidewalls of the spacer, preventing the light from being absorbed by the LED die. The LED die may be GaN based. The spacer is at least 100 microns thick. A 16% gain in light extraction is achievable using the technique compared to the light emission where phosphor is directly deposited on the LED semiconductor layers.

12 Claims, 2 Drawing Sheets

PHOSPHOR SEPARATED FROM LED BY TRANSPARENT SPACER

CROSS-REFERENCE TO PRIOR APPLICATIONS

This application is the U.S. National Phase application under 35 U.S.C. §371 of International Application No. PCT/IB2013/055207, filed on Jun. 25, 2013, which claims the benefit of U.S. Patent Application No. 61/668,062, filed on Jul. 5, 2012. These applications are hereby incorporated by reference herein.

FIELD OF THE INVENTION

This invention relates to phosphor-converted light emitting diodes (LEDs) and, in particular, to a technique for improving light extraction efficiency in such LEDs.

BACKGROUND

Providing a phosphor layer, such as a yellow YAG phosphor, over a blue LED die is common. Typically, a phosphor is provided directly over a blue LED die to make white light. Blue light leaking through the phosphor, combined with the phosphor light, produces white light. There are many ways to deposit the phosphor layer over the LED die.

The blue light exciting the phosphor causes the phosphor to emit photons in all directions. For a relatively thin phosphor layer, it can be assumed that 50% of the phosphor light is emitted upward away from the LED die, and 50% of the phosphor light is emitted toward the LED die and impinges on the LED die surfaces. For gallium nitride (GaN) based LED dies, about 15% of the phosphor light impinging on the LED die surface is absorbed by the LED material and about 85% is reflected back towards the phosphor layer. Therefore, since about half of the phosphor light impinges on the LED surface, and 15% of that light is absorbed, about 7.5% of all light emitted by the phosphor layer is wasted by being absorbed by the LED material. This is the largest loss mechanism in the system.

What is needed is a technique to reduce this loss caused by the LED die's absorption of the phosphor light.

SUMMARY

A GaN-based LED is grown on a transparent sapphire, SiC, or other growth substrate. Such substrates are typically around 75 microns thick, where the thickness is selected to provide the minimum necessary mechanical support for the LED wafer during processing. In one embodiment, after the LEDs are singulated, many LED dies are mounted on a single submount wafer or a lead frame assembly so that all the LED dies may be easily handled and processed. For flip chip LED dies, after mounting the LED dies on the submount wafer, the growth substrate faces upward and is exposed. The growth substrate may then be removed by laser liftoff.

A transparent glass plate is then affixed over each LED by a thin silicone adhesive (e.g., less than 50 microns). The glass plate is preferably greater than 100 microns thick and, in one embodiment, is 250-400 microns thick. Glass has an index of refraction of about 1.5.

A phosphor layer is then deposited over the top surface and sidewalls of the glass plate, such as by spraying, or by laminating a pre-formed phosphor sheet over the glass plate and submount wafer surface, or by other suitable techniques. In one embodiment, the phosphor is infused in a silicone binder. The silicone has an index of refraction of about 1.5, so the phosphor layer effectively has an index of about 1.5. The thickness of the phosphor layer will typically be 30-75 microns.

Since the phosphor layer and glass plate have approximately the same index of refraction, any phosphor light emitted toward the glass plate surface will enter the glass plate and, unless impinging on the LED top surface, will directly pass through the glass plate with little or no internal reflection. Any phosphor light that enters the glass plate and reflects off the LED die will have a 15% attenuation due to absorption by the die.

Since the glass plate is relatively thick compared to the LED die (the semiconductor layers may be only a few microns), much of the phosphor light that enters the glass plate will exit from the sidewalls of the glass plate without contacting the LED die. Therefore, the absorption by the LED material will be much less compared to if the phosphor were directly deposited on the LED die. The inventors have simulated the resulting LED structure and a 16% gain in light extraction was obtained versus a device where the phosphor layer was deposited directly over the LED die surface.

The resulting LED structure has much more side emission compared to a conventional LED structure where the phosphor layer is deposited directly over the LED die. If side emission is not desired, the LED structure may be mounted in a reflective cup. If total side emission is desired, a reflective metal layer may be deposited over the phosphor layer. Optionally, the glass plate may be formed with a dimple to cause the conformal phosphor layer and metal reflector to direct the light away from the LED die. This will improve the light extraction efficiency even more since less light will impinge on the LED die. Such a side-emitting LED is suitable for a backlight where the printed circuit board supporting the LED modules is parallel to the light guide, and the side emission is coupled into the edges of the light guide.

The indices of refraction of the glass plate and phosphor layer are preferably matched to reduce reflection. However, even if the indices are not matched, there will be some reflection of phosphor light off the glass plate external surfaces, still increasing the light extraction efficiency by reducing absorption by the LED die.

In another embodiment, the transparent growth substrate is not removed, and the phosphor is deposited over the growth substrate. For such an embodiment, it is desirable to use a growth substrate much thicker than the conventional 75 micron substrate. In one embodiment, the growth substrate is between 100-400 microns thick. Any phosphor light entering the thick substrate will most likely exit the substrate sidewalls without contacting the LED die surface.

The glass plate and substrate may be made thicker than 400 microns but there is a tradeoff between performance and material costs. Instead of using a glass plate, sapphire plates may be affixed to the LED die.

In one embodiment, the submount or lead frame has a reflective top surface, such as formed by a silver layer, so any phosphor light or LED light will reflect off the submount or lead frame and not be absorbed.

A hemispherical lens, such as formed of silicone, is molded over all the LEDs. The submount wafer is then singulated or the lead frames are separated.

Other embodiments are disclosed.

BRIEF DESCRIPTION OF THE DRAWINGS

Elements that are the same or similar are labeled with the same numeral.

DETAILED DESCRIPTION

The present inventive technique may be applicable to many types of different LEDs, and one example of an LED structure will be described to illustrate the invention's application.

Figure 1:
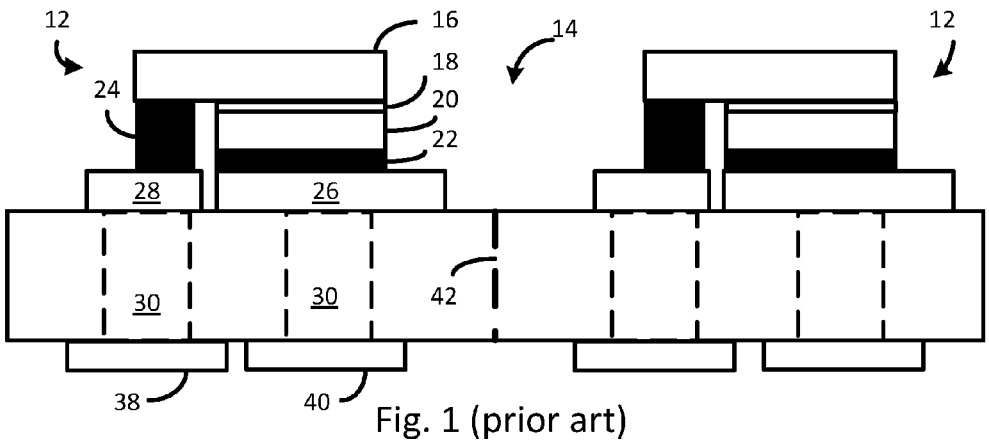
FIG. 1 is a cross-sectional simplified view of a prior art blue or UV flip-chip LED die mounted on a submount wafer along with other LED dies.

Prior art FIG. 1 illustrates a conventional flip chip LED die 12 mounted on a portion of a submount wafer 14. In a flipchip, both the n and p contacts are formed on the same side of the LED die. The LED die may be any other type of die, including a die with one or both electrodes on its top surface.

In this disclosure, the term "submount wafer" is intended to mean a support for an array of LED dies, where metal pads on the wafer are bonded to electrodes on the LED dies, and the wafer is later singulated to form one or more LED dies on a single submount.

Instead of a submount wafer, the LED dies 12 may be mounted on a reflective lead frame assembly, where multiple lead frames are interconnected by metal tabs which are later sawed through to singulate the LEDs/lead frames. The lead frames may be silver-coated copper. Each lead frame will have at least two metal pads for connection to the LED die electrodes and at least two terminals for connection to a printed circuit board.

The LED die 12 is formed of semiconductor epitaxial layers, including an n-layer 16, an active layer 18, and a p-layer 20, grown on a growth substrate, such as a sapphire substrate. The growth substrate has been removed in FIG. 1 by laser lift-off, etching, grinding, or by other techniques. In one example, the epitaxial layers are GaN based, and the active layer 18 emits blue light. LED dies that emit UV light are also applicable to the present invention.

A metal electrode 22 electrically contacts the p-layer 20, and a metal electrode 24 electrically contacts the n-layer 16. In one example, the electrodes 22 and 24 comprise gold and are ultrasonically welded to metal pads 26 and 28 on a ceramic submount wafer 14. The submount wafer 14 has conductive vias 30 leading to bottom metal pads 40 for bonding to a printed circuit board. Many LED dies 12 are mounted on the submount wafer 14 and will be later singulated along typical line 42 to form individual LEDs/submounts.

Further details of LEDs can be found in the assignee's U.S. Pat. Nos. 6,649,440 and 6,274,399, and U.S. Patent Publications US 2006/0281203 A1 and 2005/0269582 A1, all of which are incorporated herein by reference.

Figure 2:
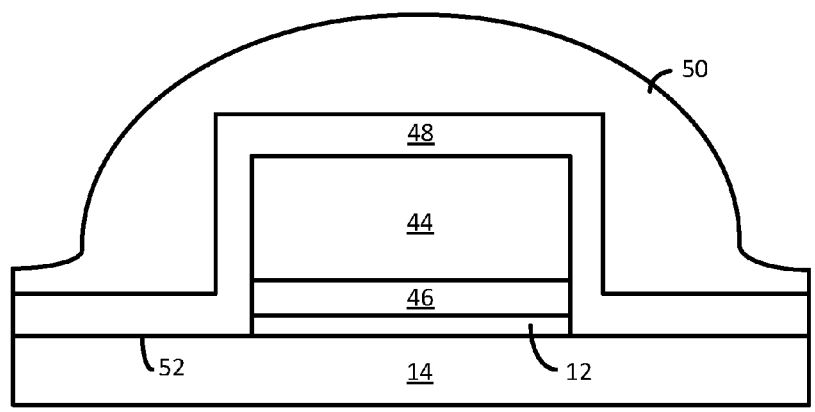
FIG. 2 is a cross-sectional view of an even further simplified LED die and submount wafer from FIG. 1 having a glass plate affixed to the top surface of the LED die and a phosphor layer deposited over the top surface and sidewalls of the glass plate.

FIG. 2 is a cross-sectional view of a simplified LED die 12 in FIG. 1 mounted on the submount wafer 14 via metal pads 26, 28 (shown in FIG. 1). The surface of the submount wafer 14 is provided with a silver reflective layer 52 surrounding the LED die 12, or the metal pads 26, 28 are reflective and extend beyond the LED die 12.

The LED die 12 without the growth substrate is only a few microns thick. A transparent a glass plate 44 is affixed to the top surface of the LED die 12 with a very thin layer of silicone 46. The silicone 46 is as thin as practical and typically around 50 microns thick. The silicone 46 may be deposited by spraying or printing though a mask. The glass plate 44 should be relatively thick, such as 100-400 microns and preferably greater than 250 microns thick. The glass plate 44 may be fabricated by many techniques, including a well-known liquid glass technique, and positioned using automated pick and place machines.

In one embodiment, the silicone 46 has a phosphor infused in it to provide some initial wavelength conversion of the blue LED light. The phosphor in the silicone 46 may be a YAG phosphor, a green phosphor, a red phosphor, or any other phosphor.

A phosphor layer 48 is then deposited over the top surface and sidewalls of the glass plate 44. The phosphor layer 48 may be a pre-formed phosphor sheet, formed of a mixture of phosphor powder and silicone, that is tested then laminated over the LED dies 12 and submount wafer 14. The phosphor may be a YAG phosphor. After the sheet is pressed over the glass plates 44 and submount wafer 14 surface to conform the sheet to the surfaces, the sheet is then heated to affix the phosphor layer 48 over the glass plate 44 and the sides of the LED 12. The phosphor layer 48 may instead be sprayed on, screen printed on, deposited by electrophoresis, or deposited by other means. In one embodiment, the phosphor layer is 30-75 microns thick, depending on the color desired, the LED intensity, the density of the phosphor, and other considerations. The phosphor layer 48 may comprise a combination of phosphors or may be a plurality of phosphor layers to achieve the desired color. In one embodiment, the overall output of the LED structure is white light having any color temperature.

The indices of refraction of the glass plate (e.g., n=1.5) and phosphor layer (e.g., n=1.5) are preferably matched to reduce reflection at the interface. However, even if the indices are not matched, there will be some reflection of phosphor light off the glass plate 44 external surfaces, still increasing the light extraction efficiency by reducing absorption by the LED die 12.

All LED dies 12 on the submount wafer 14 or lead frame assembly are processed together, to the maximum extent possible, to simplify handling, improve uniformity, speed up the processing, and reduce cost.

Hemispherical lenses 50 are then simultaneously molded over all the LED dies 12 to increase light extraction and encapsulate the LED dies 12 for protection. The lenses 50 may be silicone.

Figure 3:
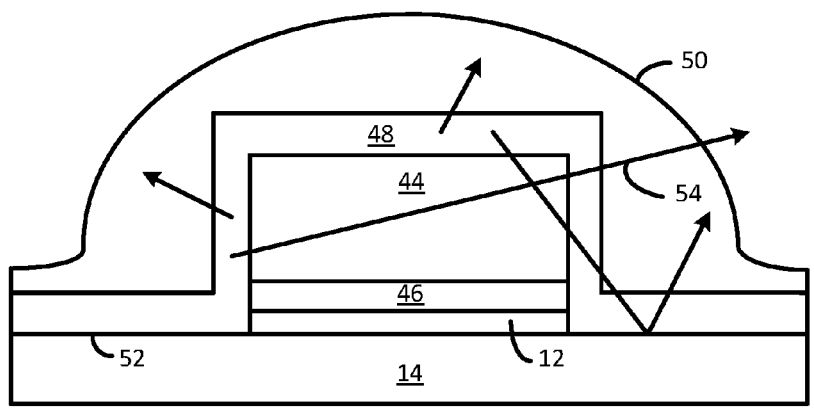
FIG. 3 illustrates the structure of FIG. 2 showing how various light rays from the phosphor layer pass through the glass plate and exit through the sidewalls of the glass plate, avoiding impinging on the LED die surface.

As shown in FIG. 3, the structure of FIG. 2 causes more light 54 to exit from the sides of the LED structure, since the side walls of the LED structure are much thicker than those of a conventional phosphor-coated LED. Refraction of light and scattering of light by the phosphor layer 48 is not considered in FIG. 3 for simplicity. If the phosphor layer 48 on the top surface of the glass plate 44 emits light at a sufficient angle, all that light will exit the sidewalls of the glass plate 44 rather than impinging on the LED die 12 and being partially absorbed. A vast majority of the light emitted by the phosphor layer 48 on the sidewalls of the glass plate 44 will not impinge on the LED die 12. Light that impinges on the submount surface will be reflected upward by the reflective layer 52. A thicker glass plate will reduce the amount of phosphor light impinging on the LED die 12, thus reducing absorption even more.

If is desired for the LED structure to be a 100% side emitting LED structure, a metal reflective layer (e.g., aluminum or silver) may be deposited over the top surface of the phosphor layer 48 to prevent light from exiting through the top of the LED structure and cause all emitted light to be side light.

Figure 4:
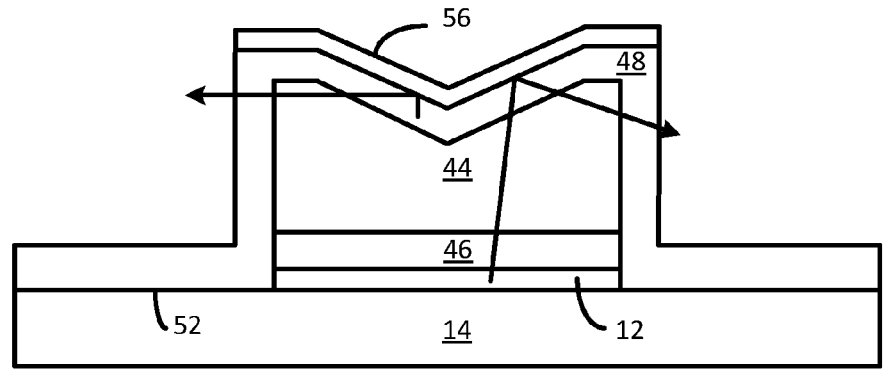
FIG. 4 illustrates a structure similar to FIG. 2 but with the glass plate having a dimple and a metal reflector over the phosphor layer for causing all side emission.

FIG. 4 illustrates a side-emitting LED structure, where the glass plate 44 is formed with a dimple, which may be conical with a sharp point or a curved point. The phosphor layer 48 and a deposited metal film 56 conform to the dimple shape. The metal film 56 reflects all light toward the sides of the glass plate 44 to form a side emitting LED structure. Such a side emitting LED is suitable for thin backlights, where the printed circuit board supporting the LED structures is parallel to a light guide, and the side light is coupled into the edges of the light guide.

In one embodiment, a sapphire plate or other transparent material may be used for the plate 44.

In simulations conducted on an LED structure similar to FIG. 2, a 16% gain in light extraction was obtained versus a device where the phosphor layer was deposited directly over the LED die 12 surface.

Figure 5:
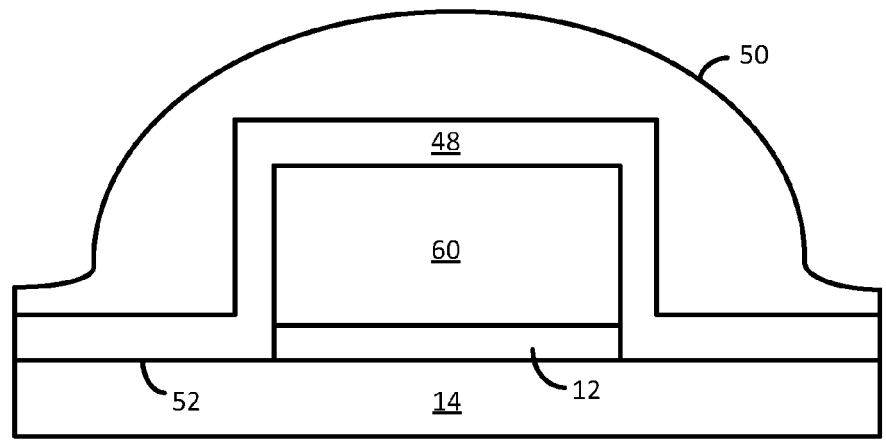
FIG. 5 is a cross-sectional view of a simplified LED die and submount wafer with the LED die's transparent growth substrate still in-tact and a phosphor layer deposited over the substrate.

FIG. 5 is a cross-sectional view of another simplified LED die 12 on the submount wafer 14 with its transparent growth substrate 60 still in-tact and the phosphor layer 48 over the substrate 60. The substrate 60 is transparent and may be sapphire, GaN, SiC, or other suitable substrate. In one embodiment, the substrate 60 is between 100-400 microns thick, and preferably greater than 250 microns, to greatly improve the light extraction efficiency. The added thickness results in much more side light for the same reasons given with respect to FIG. 2. Since sapphire has an index of refraction of about 1.77, the silicone used as a binder in the phosphor layer 48 may be selected to have an index of around 1.77 to minimize reflection of the phosphor light off the sapphire and minimize total internal reflection.

Figure 6:
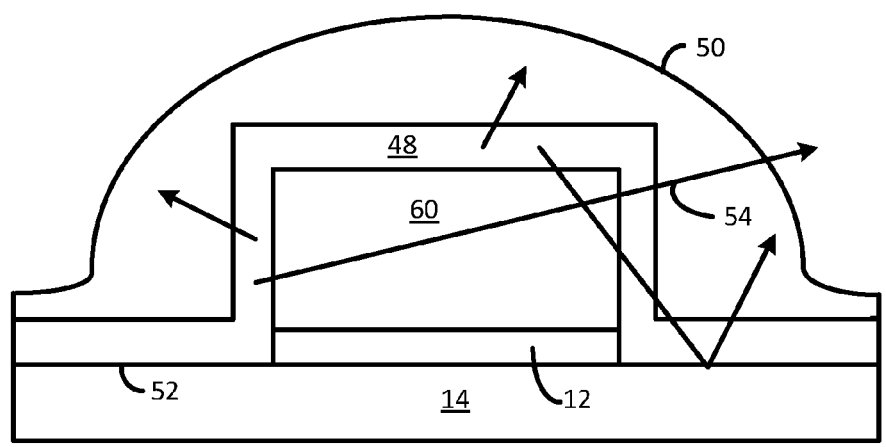
FIG. 6 illustrates the structure of FIG. 5 showing how various light rays from the phosphor layer pass through the transparent growth substrate and exit through the sidewalls of the substrate, avoiding impinging on the LED die surface.

FIG. 6 illustrates the structure of FIG. 5 showing how the phosphor light 54 passes through the substrate 60 and exits the sidewalls of the substrate, rather than impinging on the absorbing LED die 12. As a result, light extraction efficiency is greatly increased over the prior art structures.

After hemispherical lenses 50 are then molded onto the devices, the submount wafer 14 is singulated to form a plurality of packaged LED structures. FIGS. 2-6 may represent the LED structures after singulation, with metal pads on the bottom of the submounts for bonding to pads of a printed circuit board. If a phosphor sheet is laminated to the submount wafer 14, the phosphor sheet extends to the edges of the packaged LED structure, similar to that shown in FIGS. 2-5. In the alternative, molding the lenses, forming the phosphor, or attaching the glass may occur after singulation.

In all embodiments, the submount wafer 14 may be replaced by a reflective lead frame assembly. No further, packaging is required once the LED die 12 is encapsulated by the lens 50.

Other mounts for the LED dies 12 are also envisioned.

In one embodiment, the width and length of the LED die 12 is about 1 mm per side, and the entire packaged LED structure is less than 3 mm per side.

Although the glass plate 44 and substrate 60 are referred to as "transparent," perfect transparency is not realizable, and the term "transparent" is taken to mean a typical transparency of the material, which is substantially transparent to the wavelengths of light emitted by the LED die 12 or emitted by the phosphor layer 48.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A phosphor-converted light emitting diode (LED) structure comprising:
   an LED die having epitaxial semiconductor layers grown on a growth substrate, wherein the growth substrate has been removed;
   a substantially transparent layer affixed to a top surface of the LED die, the substantially transparent layer having a thickness greater than 250 microns, the substantially transparent layer having a top surface and sidewalls; and
   a phosphor layer in direct contact with the top surface and sidewalls of the substantially transparent layer such that some light emitted by the phosphor layer into the substantially transparent layer exits out of the sidewalls of the substantially transparent layer.

2. The structure of claim 1 wherein the substantially transparent layer is affixed to the LED die with an adhesive layer.

3. The structure of claim 2 wherein the adhesive layer comprises silicone.

4. The structure of claim 1 wherein the substantially transparent layer comprises a glass layer affixed over the LED die.

5. The structure of claim 4 wherein a growth substrate for the epitaxial semiconductor layers has been removed prior to the substantially transparent layer being affixed over the LED die.

6. The structure of claim 1 further comprising a lens over the phosphor layer encapsulating the LED die.

7. The structure of claim 1 further comprising a submount on which the LED die is mounted, wherein a top surface portion of the submount is reflective to reflect downward light emitted by the LED die and phosphor layer.

8. The structure of claim 1 further comprising a reflective lead frame assembly on which the LED die is mounted.

9. The structure of claim 1 wherein the LED die emits blue light, and the phosphor light combined with the blue light creates white light.

10. The structure of claim 1 wherein the substantially transparent layer and the phosphor layer have approximately the same index of refraction.

11. The structure of claim 1 wherein the LED die is a flip chip.

12. The structure of claim 1 wherein the substantially transparent layer is affixed to the LED die with an adhesive layer containing phosphor.

* * * * *